(12) United States Patent
Kim

(10) Patent No.: US 10,192,794 B2
(45) Date of Patent: Jan. 29, 2019

(54) WAFER TRANSFER DEVICE

(71) Applicant: SK SILTRON CO., LTD., Gumi-si, Gyeongsangbuk-do (KR)

(72) Inventor: So Mi Kim, Gumi-si (KR)

(73) Assignee: SK SILTRON CO., LTD., Gumi-si, Gyeongsangbuk-Do (KR)

(*) Notice: Subject to any disclaimer, the term of this patent is extended or adjusted under 35 U.S.C. 154(b) by 0 days.

(21) Appl. No.: 15/541,631

(22) PCT Filed: Jun. 17, 2015

(86) PCT No.: PCT/KR2015/006131
§ 371 (c)(1),
(2) Date: Jul. 5, 2017

(87) PCT Pub. No.: WO2016/117777
PCT Pub. Date: Jul. 28, 2016

(65) Prior Publication Data
US 2018/0005907 A1    Jan. 4, 2018

(30) Foreign Application Priority Data
Jan. 22, 2015  (KR) .................. 10-2015-0010385

(51) Int. Cl.
*H01L 21/66*     (2006.01)
*H01L 21/677*   (2006.01)
(Continued)

(52) U.S. Cl.
CPC .............. *H01L 22/26* (2013.01); *B08B 3/04* (2013.01); *H01L 21/02057* (2013.01);
(Continued)

(58) Field of Classification Search
USPC ............................................................ 438/8
See application file for complete search history.

(56) References Cited

U.S. PATENT DOCUMENTS 6,331,890 B1    12/2001  Marumo et al.
6,339,730 B1 *   1/2002  Matsushima ..... H01L 21/67167
                                                                    318/568.16
(Continued)

FOREIGN PATENT DOCUMENTS

JP    H02-106830    8/1990
JP    H03-250749    11/1991
(Continued)

OTHER PUBLICATIONS

International Search Report (with English Translation) and Written Opinion dated Oct. 22, 2015 issued in Application No. PCT/KR2015/006131.

(Continued)

*Primary Examiner* — Moazzam Hossain
*Assistant Examiner* — Lawrence C Tynes, Jr.
(74) *Attorney, Agent, or Firm* — Ked & Associates, LLP

(57) ABSTRACT

An embodiment comprises: a guide moving in the vertical direction or the horizontal direction; a transfer arm provided on the guide and loading spaced apart wafers; a laser emission unit disposed on the guide and emitting first laser beams at the spaced apart wafers loaded on the transfer arm; and a laser detection unit disposed below the transfer arm and collecting, from among the first laser beams, second laser beams having passed through gaps between the spaced apart wafers.

12 Claims, 4 Drawing Sheets

(51) Int. Cl.
  *H01L 21/67* (2006.01)
  *H01L 21/268* (2006.01)
  *B08B 3/04* (2006.01)
  *H01L 21/02* (2006.01)
  *H01L 21/306* (2006.01)

(52) U.S. Cl.
  CPC ...... *H01L 21/268* (2013.01); *H01L 21/30604* (2013.01); *H01L 21/677* (2013.01); *H01L 21/67023* (2013.01); *H01L 21/67253* (2013.01); *H01L 21/67742* (2013.01); *Y10S 414/138* (2013.01); *Y10S 414/14* (2013.01); *Y10S 414/141* (2013.01)

(56) References Cited

U.S. PATENT DOCUMENTS

| | | | | |
|---|---|---|---|---|
| 6,671,059 | B2* | 12/2003 | Frisa | H01L 22/12 250/559.27 |
| 8,313,277 | B2* | 11/2012 | van der Meulen | B65G 25/02 414/217 |
| 2010/0093259 | A1* | 4/2010 | Lee | B24B 37/013 451/5 |

FOREIGN PATENT DOCUMENTS

| | | |
|---|---|---|
| JP | H06-151401 | 5/1994 |
| JP | H06-267919 | 9/1994 |
| JP | H08-051092 | 2/1996 |
| JP | H 08-129353 | 5/1996 |
| JP | H11-176912 | 7/1999 |
| KR | 10-0118207 | 9/1997 |
| KR | 10-2006-0039134 | 5/2006 |
| KR | 10-2008-0054859 | 6/2008 |
| KR | 10-1469000 | 12/2014 |

OTHER PUBLICATIONS

Korean Office Action dated Apr. 6, 2016 issued in Application No. 10-2015-0010385.
Korean Notice of Allowance dated Nov. 11, 2016 issued in Application No. 10-2015-0010385.
Japanese Office Action dated Aug. 31, 2018 issued in Application No. 2017-536278.

* cited by examiner

WAFER TRANSFER DEVICE

CROSS-REFERENCE TO RELATED PATENT APPLICATIONS

This application is a U.S. National Stage Application under 35 U.S.C. § 371 of PCT Application No. PCT/KR2015/006131, filed Jun. 17, 2015, which claims priority to Korean Patent Application No. 10-2015-0010385, filed Jan. 22, 2015, whose entire disclosures are hereby incorporated by reference.

TECHNICAL FIELD

Embodiments relate to a wafer transfer device.

BACKGROUND ART

Generally, in order to check the amount of etching, which is an important quality item of a wafer-etching process, it is necessary to measure the thickness of a wafer to be etched.

The thickness of the wafer is measured using thickness measurement equipment before a wafer-etching process, and after the wafer is etched using etching equipment, the thickness of the wafer is again measured.

The thickness of the wafer may be measured using a difference in electric capacity, which depends on a gap between a target, i.e. the wafer, and an electric-capacity-measuring probe by forming an electric field between the wafer and the electric-capacity-measuring probe.

As described above, the thickness of the wafer is generally measured using separate thickness measurement equipment before and after wafer etching in order to check the amount of etching. However, such duplicate thickness measurements may incur time and labor losses.

Technical Object

Embodiments provide a wafer transfer device, which may reduce time and labor losses due to wafer thickness measurement.

Technical Solution

A wafer transfer device according to an embodiment includes a guide configured to move in a vertical direction or in a horizontal direction, a moving arm provided on the guide and configured to seat wafers, which are spaced apart from each other, thereon, a laser emission unit disposed on the guide and configured to emit a first laser to the wafers, which are seated on the moving arm and are spaced apart from each other, and a laser detection unit disposed under the moving arm and configured to collect a second laser that is a portion of the first laser and has passed through a gap between the wafers, which are spaced apart from each other.

The wafer transfer device may further include a controller configured to measure a thickness of the wafers, which are spaced apart from each other, based on the first laser emitted from the laser emission unit and the second laser collected by a laser collector.

The first laser may have an emission area in the horizontal direction, one end of the emission area may be aligned with an edge of a first wafer, among the wafers, and a remaining end of the emission area may be aligned with an edge of a last wafer among the wafers.

The wafer transfer device may further include a laser detection unit support member connected between the guide and the laser detection unit and configured to secure the laser detection unit to the guide.

The laser detection unit support member may move in the horizontal direction or in the vertical direction along with the guide.

The laser detection unit support member may include a first laser detection unit support member configured to interconnect one end of the guide and one end of the laser detection unit, and a second laser detection unit support member configured to interconnect a remaining end of the guide and a remaining end of the laser detection unit.

The moving arm may include first and second arms coupled to one end of the guide, third and fourth arms coupled to a remaining end of the guide, support portions connected to the first to fourth arms, and pedestals connected to the support portions and configured to hold the wafers thereon.

Each of the first to fourth arms may rotate about a portion thereof coupled to the guide.

The pedestals may include first and second pedestals each having one end connected to the first support portion and a remaining end connected to the third support portion, and third and fourth pedestals each having one end connected to the second support portion and a remaining end connected to the fourth support portion.

The first to fourth pedestals may include slots in which the wafers are seated.

The wafer transfer device may further include a moving rail configured to move the guide in the horizontal direction.

The guide may include a horizontal guide configured to move in the horizontal direction by the moving rail and connected to the moving arm, and a vertical guide connected to the horizontal guide and configured to move the horizontal guide in the vertical direction.

According to another embodiment, a wafer transfer device includes a guide configured to move in a vertical direction or in a horizontal direction, a moving arm connected to the guide and configured to seat wafers, which are spaced apart from each other, thereon, a laser emission unit disposed on the guide and configured to emit a laser to the wafers, which are seated on the moving arm and are spaced apart from each other, a laser detection unit disposed under the moving arm and configured to collect a laser that has passed through a gap between the wafers, which are spaced apart from each other, and a controller configured to calculate lengths of areas in which no laser is collected by a laser collector and to measure a thickness of each wafer based on a corresponding one of the calculated lengths.

According to a further embodiment, a wafer-processing method of processing wafers mounted on a wafer transfer device including a laser emission unit configured to emit a laser and a laser detection unit configured to detect the laser, includes emitting a laser to the wafers mounted on the wafer transfer device by the laser emission unit, detecting a laser that has passed between the wafers mounted on the wafer transfer device by the laser detection unit, measuring a thickness of the wafers mounted on the wafer transfer device based on the detected result, and processing the wafers mounted on the wafer transfer device based on the measured thickness.

The wafer-processing method may further include transferring the wafers by the wafer transfer device, and the emitting, the detecting, and the measuring may be performed during the transferring.

The wafer-processing method may further include comparing the measured thickness of the wafers with a predetermined thickness value, and wherein the processing may include determining whether or not to perform a processing on the wafers or controlling a processing time based on a comparison result in the comparing.

The processing may include etching the wafers.

The wafer-processing method may further include measuring, after the processing, a thickness of the wafers, processed in the processing, by performing the emitting, the detecting, and the measuring, and repeatedly performing the emitting, the detecting, the measuring, the comparing, and the processing until the measured thickness of the wafers processed in the processing becomes equal to the predetermined thickness value.

The processing may further include cleaning the wafers etched in the etching.

The processing may further include drying the wafers cleaned in the cleaning.

Advantageous Effects

Embodiments may reduce time and labor losses due to wafer thickness measurement.

MODE FOR INVENTION

Figure 1:
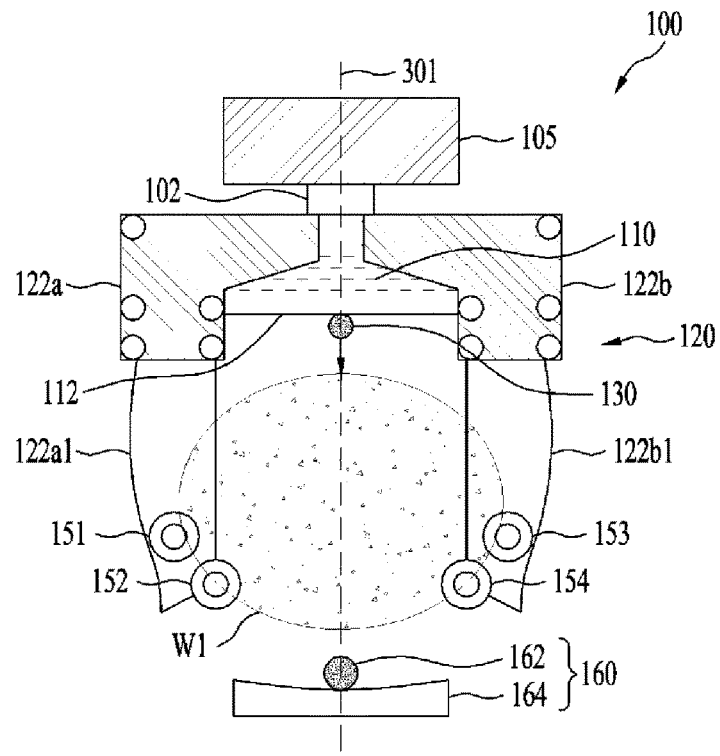
FIG. 1 is a front view of a wafer transfer device according to an embodiment.

Hereinafter, embodiments will be clearly revealed via the accompanying drawings and a description related to the embodiments. In the description of the embodiments, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. It will also be understood that "on" or "under" the element may be described relative to the drawings.

In the drawings, the size of each element may be exaggerated, omitted or schematically illustrated for clarity and convenience. In addition, the size of each element does not wholly reflect an actual size thereof. In addition, the same reference numerals indicate the same elements throughout the description of the drawings.

Figure 2:
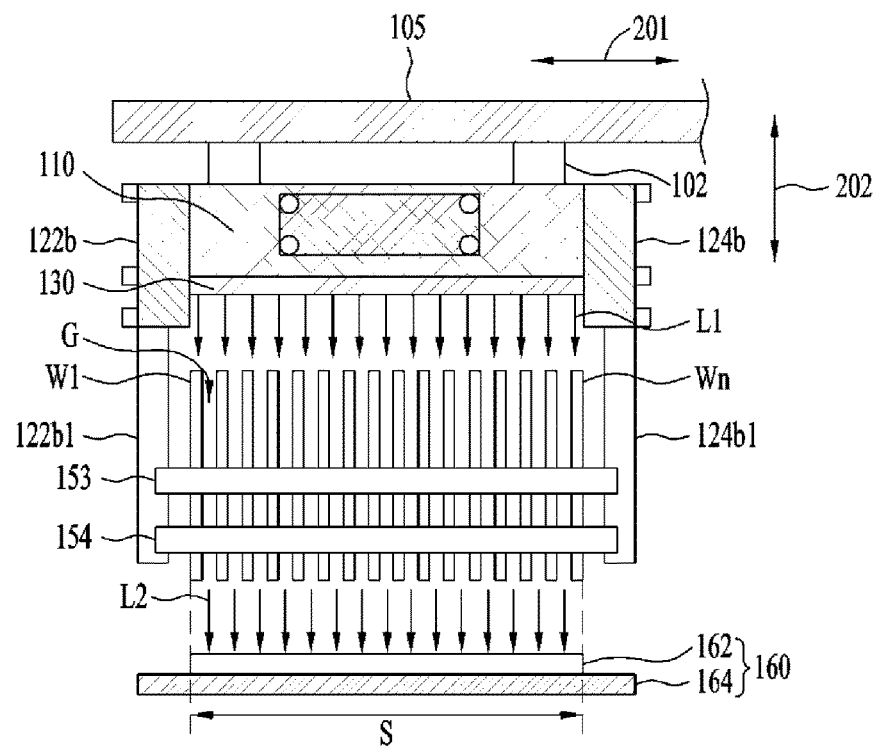
FIG. 2 is a side view of the wafer transfer device of FIG. 1.

FIG. 1 is a front view of a wafer transfer device 100 according to an embodiment, and FIG. 2 is a side view of the wafer transfer device 100 of FIG. 1.

Referring to FIGS. 1 and 2, the wafer transfer device 100 includes a vertical guide 102, a moving rail 105, a horizontal guide 110, a moving arm 120, a laser emission unit 130, and a laser detection unit 160.

The moving arm 120 may include arms 122a, 122b, 124a and 124b, support portions 122a1, 122b1, 124a1 and 124b1, and pedestals 151 to 154.

The moving rail 105 is connected to the vertical guide 102, and moves the vertical guide 102 in a first direction, for example, in a horizontal direction 201.

The vertical guide 102 interconnects the horizontal guide 110 and the moving rail 105, is movable along the moving rail 105, and moves the horizontal guide 110 in a second direction, for example, in a vertical direction 202.

The horizontal guide 110 is connected to the vertical guide 102, is connected to the moving rail 105 via the vertical guide 102, and is movable in the vertical direction 202 by the vertical guide 102 and movable in the horizontal direction 201 by the moving rail 105.

The horizontal guide 110 supports the moving arm 120 and may have a plate or box shape, without being limited thereto, and may have a sufficient shape or length for transferring multiple wafers.

The moving arm 120 is connected and/or fixed to the horizontal guide 110, and may grip or support multiple wafers spaced apart from each other.

For example, the moving arm 120 may grip or support edge portions of multiple wafers, which are spaced apart from each other such that the front surface or the rear surface thereof is parallel to the vertical direction 202.

For example, one end of the moving arm 120 may be connected to the horizontal guide 110 so that the moving arm 120 may rotate about the end thereof that is connected to the horizontal guide 110, and the other end of the moving arm 120 may grip or support edge portions of multiple wafers, which are spaced apart from each other.

The moving arm 120 may include first and second arms 122a and 122b coupled or fixed to one end of the horizontal guide 110, third and fourth arms 124a and 124b coupled or fixed to the other end of the horizontal guide 110, the support portions 122a1, 122b1, 124a1 and 124b1 connected to the first to fourth arms 122a, 122b, 124a and 124b, and the pedestals 151 to 154 connected to the support portions 122a1, 122b1, 124a1 and 124b1 so as to hold wafers W1 to Wn (where n is a natural number greater than 1) thereon. The elements 124a and 124a1 are not illustrated in FIGS. 1 and 2, but may have the same shape as the elements 122a and 122a1.

On the basis of a center line 301 of the horizontal guide 110, the first arm 122a may be coupled or fixed to one side of one end of the horizontal guide 110 and the second arm 122b may be coupled or fixed to the other side of one end of the horizontal guide 110. For example, the center line 301 of the horizontal guide 110 may be a virtual line that passes through the center of one end of the horizontal guide 110 and is parallel to the vertical direction 202.

On the basis of the center line 301 of the horizontal guide 110, the third arm 124a may be coupled or fixed to one side of the other end of the horizontal guide 110 and the fourth arm 124b may be coupled or fixed to the other side of the other end of the horizontal guide 110. For example, the center line 301 of the horizontal guide 110 may be a virtual line that passes through the center of the other end of the horizontal guide 110 and is parallel to the vertical direction 202.

In order to grip or support the wafers W1 to Wn (where n is a natural number greater than 1), each of the first to fourth arms 122a, 122b, 124a and 124b may rotate by a predetermined angle about the portion thereof that is coupled or fixed to the horizontal guide 110.

Each of the support portions 122a1, 122b1, 124a1 and 124b1 is connected to a corresponding one of the first to fourth arms 122a, 122b, 124a and 124b, and serves to support the pedestals 151 to 154.

For example, one end of a first support portion 122a1 may be connected to the first arm 122a, one end of a second support portion 122b1 may be connected to the second arm 122b, one end of a third support portion 124a1 may be connected to the third arm 124a, and one end of a fourth support portion 124b1 may be connected to the fourth arm 124a.

The pedestals 151 to 154 are connected between the first and second arms 122a and 122b and the third and fourth arms 124a and 124b.

For example, one end of each of the first and second pedestals 151 and 152 may be connected to the first support portion 122a1, and the other end of each of the first and second pedestals 151 and 152 may be connected to the third support portion 124a1. In order to stably support edge portions of the wafers W1 to Wn (where n is a natural number greater than 1) having a curved outer circumferential surface, the first pedestal 151 may be located above the second pedestal 152, and the first pedestal 151 may be spaced farther apart from the center line 301 of the horizontal guide 110 than the second pedestal 152 in the horizontal direction 201.

For example, the distance from the center line 301 of the horizontal guide 110 to the first pedestal 151 may be greater than the distance from the center line 301 to the second pedestal 152.

In addition, one end of each of the third and fourth pedestals 153 and 154 may be connected to the second support portion 122b1, and the other end of each of the third and fourth pedestals 153 and 154 may be connected to the fourth support portion 124b1. In addition, in order to stably support edge portions of the wafers W1 to Wn (where n is a natural number greater than 1) having a curved outer circumferential surface, the third pedestal 153 may be located above the fourth pedestal 154, and the third pedestal 153 may be spaced farther apart from the center line 301 of the horizontal guide 110 than the fourth pedestal 154 in the horizontal direction 201.

For example, the distance from the center line 301 of the horizontal guide 110 to the third pedestal 153 may be greater than the distance from the center line 301 to the fourth pedestal 154.

Although not illustrated, in order to stably support the wafers W1 to Wn (where n is a natural number greater than 1), each of the first to fourth pedestals 151 to 154 may have grooves or slots, which are spaced apart from each other, for allowing the wafers W1 to Wn (where n is a natural number greater than 1) to be inserted, seated, or loaded therein.

The laser emission unit 130 is disposed on the horizontal guide 110 and emits a laser L1. For example, the laser emission unit 130 may be disposed on a lower surface 112 of the horizontal guide 110, and may emit the laser L1 toward the wafers W1 to Wn (where n is a natural number greater than 1), which are seated or loaded on the first to fourth pedestals 151 to 154. The laser L1 of the laser emission unit 130 may be emitted in the vertical direction 202.

The laser detection unit 160 is disposed under the moving arm 120 and is spaced apart from the moving arm 120 so as to face the laser emission unit 130.

For example, the laser detection unit 160 may be disposed under the first to fourth arms 122a, 122b, 124a and 124b and the pedestals 151 to 154, and may be spaced apart from the first to fourth arms 122a, 122b, 124a and 124b and the pedestals 151 to 154.

The laser detection unit 160 may include a laser collector 162, which detects or collects a laser L2 that is a portion of the laser L1 emitted from the laser emission unit 130 and has passed through a gap G between the wafers W1 to Wn (where n is a natural number greater than 1), and a laser collector support portion 164 configured to support the laser collector 162. In another embodiment, the laser collector support portion 164 may be omitted.

The laser L1 emitted by the laser emission unit 130 may overlap the wafers W1 to Wn (where n is a natural number greater than 1), which are seated or loaded on the first to fourth pedestals 151 to 154 and are spaced apart from each other, in the vertical direction 202.

Figure 4:
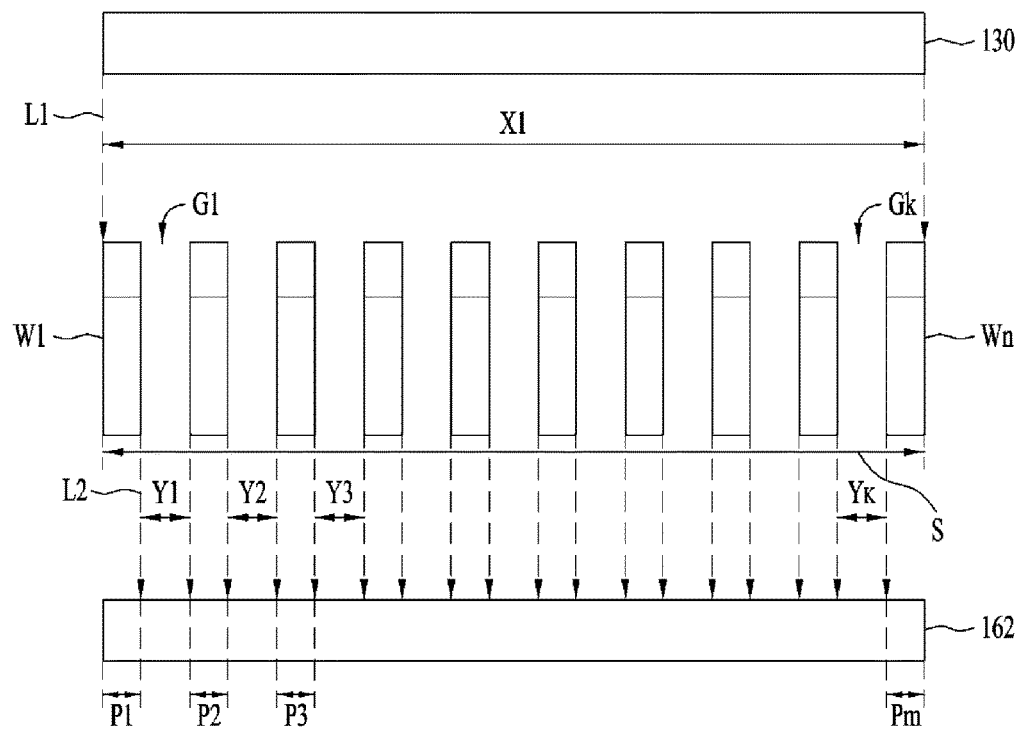
FIG. 4 is a view illustrating a laser emission unit and a laser collector illustrated in FIG. 2.

FIG. 4 is a view illustrating the laser emission unit 130 and the laser collector 162 illustrated in FIG. 2.

Referring to FIG. 4, in the laser L1 emitted by the laser emission unit 130, the length X1 of the emission area thereof in the horizontal direction 201 may be equal to or greater than the length of the wafer seating area S of the first to fourth pedestals 151 to 154. This serves to enable the measurement of the thickness of the wafers. Here, the wafer seating area S may include an area in which the wafers W1 to Wn (where n is a natural number greater than 1) are disposed and areas located between the wafers W1 to Wn (where n is a natural number greater than 1).

For example, in the laser L1 emitted by the laser emission unit 130, one end of the emission area thereof in the horizontal direction 201 may be aligned with one end or edge of a first wafer W1, which is seated or loaded on the first to fourth pedestals 151 to 154, and the other end of the emission area thereof in the horizontal direction 201 may be aligned with one end or edge of a last wafer Wn, which is seated or loaded on the first to fourth pedestals 151 to 154.

For example, one end of the first wafer W1 may be an edge of one surface of the first wafer W1 opposite the other surface of the first wafer W1 facing a second wafer W2, and one end of the last wafer Wn may be an edge of one surface of the last wafer Wn opposite the other surface of the last wafer Wn facing a wafer Wn−1 immediately before the last wafer.

In addition, the laser collector 162 is disposed under the first to fourth arms 122a, 122b, 124a and 124b so as to be aligned with or correspond to the laser emission unit 130 in the vertical direction 202.

For example, the laser collector 162 may be disposed under the first to fourth pedestals 151 to 154, and may collect the laser L2 that has passed through gaps G1 to Gk (where k is a natural number greater than 1 and less than n) between the wafers W1 to Wn (where n is a natural number greater than 1).

The total sum of the thicknesses of the wafers W1 to Wn may be acquired by subtracting the length of the laser L2, collected by the laser collector 162, in the horizontal direction 201 from the length X1 of the laser L1, emitted by the laser emission unit 130, in the horizontal direction 201.

In addition, a portion of the laser L1 emitted by the laser emission unit 130 may not pass through the wafers W1 to Wn (where n is a natural number greater than 1) and may not be collected by the laser collector 162, and the remaining portion of the laser L1 emitted by the laser emission unit 130 may pass through the gaps G1 to Gk between the wafers W1 to Wn (where n is a natural number greater than 1) and may be collected by the laser collector 162.

Areas Y1 to Yk (where k is a natural number greater than 1 and less than n) in which the laser is collected by the laser collector 162 may be located between areas P1 to Pm (where m is a natural number greater than 1 and less than n) in which no laser is collected by the laser collector 162.

The length of the areas P1 to Pm (where m is a natural number greater than 1 and less than n) in which no laser is collected by the laser collector 162 may correspond to the thickness of the wafers W1 to Wn (where n is a natural number greater than 1).

Among the areas Y1 to Yk (where k is a natural number greater than 1 and less than n) in which the laser is collected by the laser collector 162, the length of the area (e.g. P2) in which no laser is collected between two neighboring areas (e.g. Y1 and Y2) may correspond to the thickness of the wafer (e.g. W2).

For example, among the areas in which no laser is collected, the length of any one area may correspond to the thickness of a corresponding wafer.

A controller (not illustrated) may measure the thickness of each of the wafers W1 to Wn (where n is a natural number greater than 1), as described above in connection with FIG. 4, based on the laser L1 emitted from the laser emission unit 130 of the wafer transfer device 100 and the laser collected by the laser collector 162.

For example, the controller may calculate the lengths of the areas P1 to Pm in which no laser is collected between the areas Y1 to Yk in which the laser is collected by the laser collector 162, and may measure the thickness of each of the wafers based on a corresponding one of the calculated lengths.

The controller (not illustrated) may be configured separately from the wafer transfer device 100, without being limited thereto, and may be configured so as to be included in the wafer transfer device 100.

Figure 3:
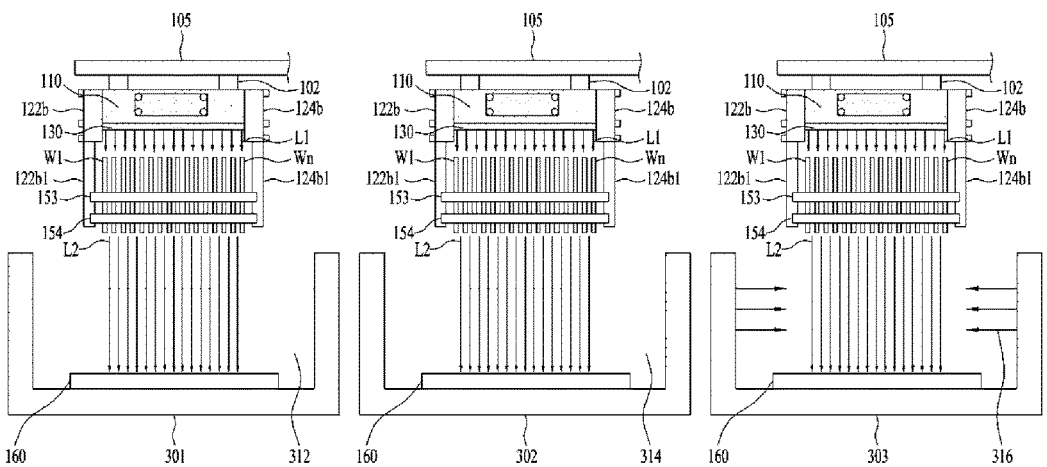
FIG. 3 is a view illustrating a wafer-processing process using the wafer transfer device illustrated in FIG. 1.

FIG. 3 is a view illustrating a wafer-processing process using the wafer transfer device 100 illustrated in FIG. 1.

Referring to FIG. 3, the wafer-processing process may include a wafer-etching process, a wafer-cleaning process, and a wafer drying process.

A first treatment liquid 312 may be accommodated in a first treatment tank 301, and a second treatment liquid 314 may be accommodated in a second treatment tank 302. A drying gas 316 may be injected into a third treatment tank 303.

The laser detection unit 160 of the wafer transfer device 100 according to the embodiment may be disposed in each of the first to third treatment tanks 301, without being limited thereto. As will be described in connection with FIG. 5, the laser detection unit 160 may be fixed to the horizontal guide 110 and may move along with the horizontal guide 110.

First, the wafers W1 to Wn (where n is a natural number greater than 1) may be loaded into the wafer transfer device 100, and the thicknesses of the loaded wafers W1 to Wn (where n is a natural number greater than 1) may be measured using the laser emission unit 130 and the laser detection unit 160 of the wafer transfer device 100.

Subsequently, the wafers W1 to Wn (where n is a natural number greater than 1) may be transferred to the first treatment tank 301 in which the first treatment liquid 312 is accommodated by the wafer transfer device 100. After the wafers W1 to Wn (where n is a natural number greater than 1) transferred to the first treatment tank 301 are immersed in the first treatment liquid 312, a first treatment process may be performed for a predetermined time. For example, the first treatment liquid 312 may be an etchant and the first treatment process may be an etching process, without being limited thereto.

While the first treatment process is performed, the thicknesses of the wafers W1 to Wn (where n is a natural number greater than 1) may be measured in real time using the laser emission unit 130 and the laser detection unit 160 of the wafer transfer device 100.

Once the first treatment process has been completed, the wafers W1 to Wn (where n is a natural number greater than 1) may be removed from the first treatment liquid 312 using the wafer transfer device 100, and the wafers that have completed the first treatment process may be transferred to the second treatment tank 302. At this time, the thickness of the wafers removed from the first treatment liquid 312 may be measured using the laser emission unit 130 and the laser detection unit 160.

Subsequently, after the wafers W1 to Wn (where n is a natural number greater than 1) transferred to the second treatment tank 302 by the wafer transfer device 100 are immersed in the second treatment liquid 314, a second treatment process may be performed for a predetermined time. For example, the second treatment liquid may be a cleaning liquid and the second treatment process may be a cleaning process, without being limited thereto.

While the second treatment process is performed, the thickness of the wafers W1 to Wn (where n is a natural number greater than 1) may be measured in real time using the laser emission unit 130 and the laser detection unit 160 of the wafer transfer device 100.

Once the second treatment process has been completed, the wafers W1 to Wn (where n is a natural number greater than 1) may be removed from the second treatment liquid 314 using the wafer transfer device 100, and the wafers that have completed the second treatment process may be transferred to the third treatment tank 303. At this time, the thickness of the wafers removed from the second treatment liquid 314 may be measured using the laser emission unit 130 and the laser detection unit 160.

Subsequently, a third treatment process of drying the wafers is performed by discharging the drying gas 316 to the wafers W1 to Wn (where n is a natural number greater than 1) transferred into the third treatment tank 303 by the wafer transfer device 100. While the third treatment process is performed, the thickness of the wafers W1 to Wn (where n is a natural number greater than 1) may be measured in real time using the laser emission unit 130 and the laser detection unit 160.

As described above, in the embodiment, the wafers may be transferred to each treatment tank for the treatment process thereof, and the thickness of the wafers may be measured in real time during the treatment processes. In the embodiment, the waste of time and labor consumed to measure the thickness may be reduced since no separate thickness measurement equipment is used.

In addition, in the embodiment, since the thickness of the wafers is measured in real time during the treatment processes, variation in the thickness of the wafers may be taken into account in the treatment process, and consequently the accuracy of the treatment process may be increased.

Figure 5:
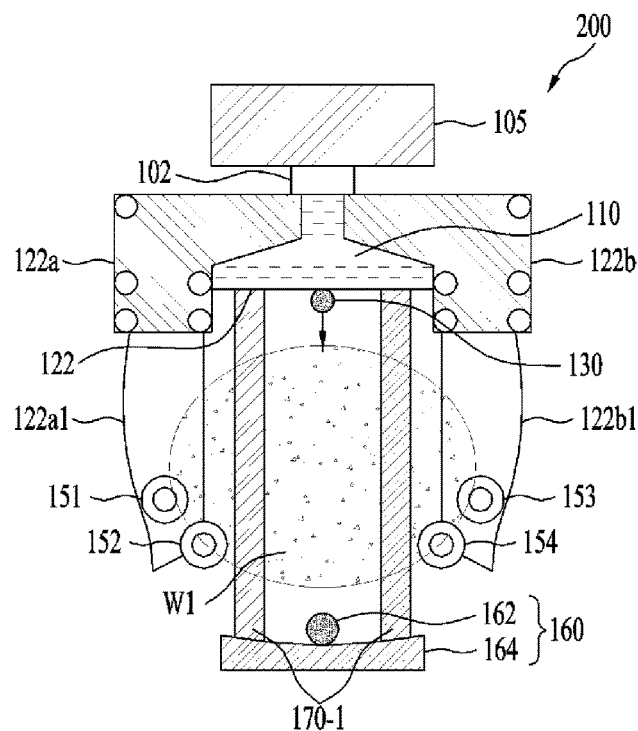
FIG. 5 is a front view of a transfer device according to another embodiment.
Figure 6:
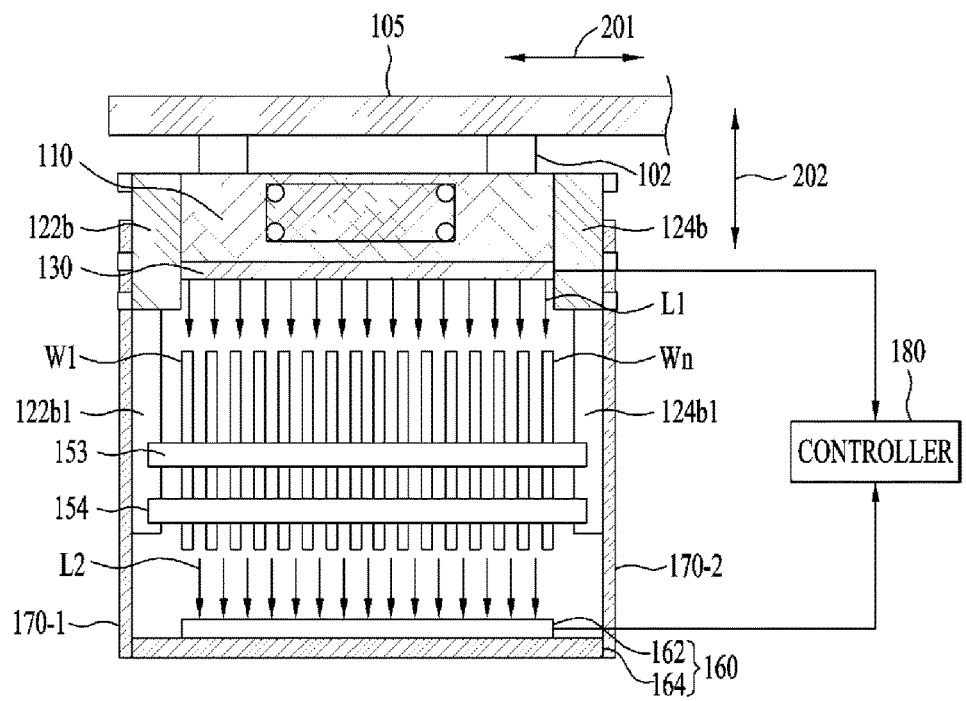
FIG. 6 is a side view of the transfer device of FIG. 5.

FIG. 5 is a front view of a transfer device 200 according to another embodiment, and FIG. 6 is a side view of the transfer device 200 of FIG. 5. The same reference numerals as those of FIGS. 1 and 2 indicate the same elements, and a description related to such corresponding elements is simplified or omitted.

Referring to FIGS. 5 and 6, the wafer transfer device 200 includes the vertical guide 102, the moving rail 105, the horizontal guide 110, the moving arm 120, the laser emission unit 130, the laser detection unit 160, and laser detection unit support members 170-1 and 170-2.

The wafer transfer device 200 may further include the laser detection unit support members 170-1 and 170-2 and a controller 180, unlike the wafer transfer device 100 illustrated in FIGS. 1 and 2.

The laser detection unit support members 170-1 and 170-2 are connected between the horizontal guide 110 and the laser detection unit 160, and secure the laser detection unit 160 to the horizontal guide 110.

A first laser detection unit support member 170-1 may interconnect one end of the horizontal guide 110 and one end of the laser detection unit 160, and a second laser detection unit support member 170-2 may interconnect the other end of the horizontal guide 110 and the other end of the laser detection unit 160.

For example, the first laser detection unit support member 170-1 may interconnect one end of the horizontal guide 110 and one end of the laser collector support portion 164, and the second laser detection unit support member 170-2 may interconnect the other end of the horizontal guide 110 and the other end of the laser collector support portion 164.

Since the laser detection unit 160 may be secured to the horizontal guide 110 by the laser detection unit support members 170-1 and 170-2, the laser detection unit 160 may move horizontally or vertically along with the horizontal guide 110 when the horizontal guide 110 moves horizontally or vertically.

The controller 180 may measure the thickness of each of the wafers W1 to Wn (where n is a natural number greater than 1), as described above in connection with FIG. 4, based on information regarding the laser L1 emitted from the laser emission unit 130 of the wafer transfer device 200 and information regarding the laser L2 collected by the laser collector 162.

Since the laser detection unit 160 moves horizontally or vertically along with the horizontal guide 110, it is not necessary to install the laser detection unit 160, which is used to measure the thickness of the wafer, in each of the treatment tanks 310 to 303, as illustrated in FIG. 3.

In addition, since the laser detection unit 160 moves horizontally or vertically along with the horizontal guide 110, the thickness of the wafers W1 to Wn (where n is a natural number greater than 1) may be measured in real time even while the wafer transfer device 200 moves along the moving rail 105.

Figure 7:
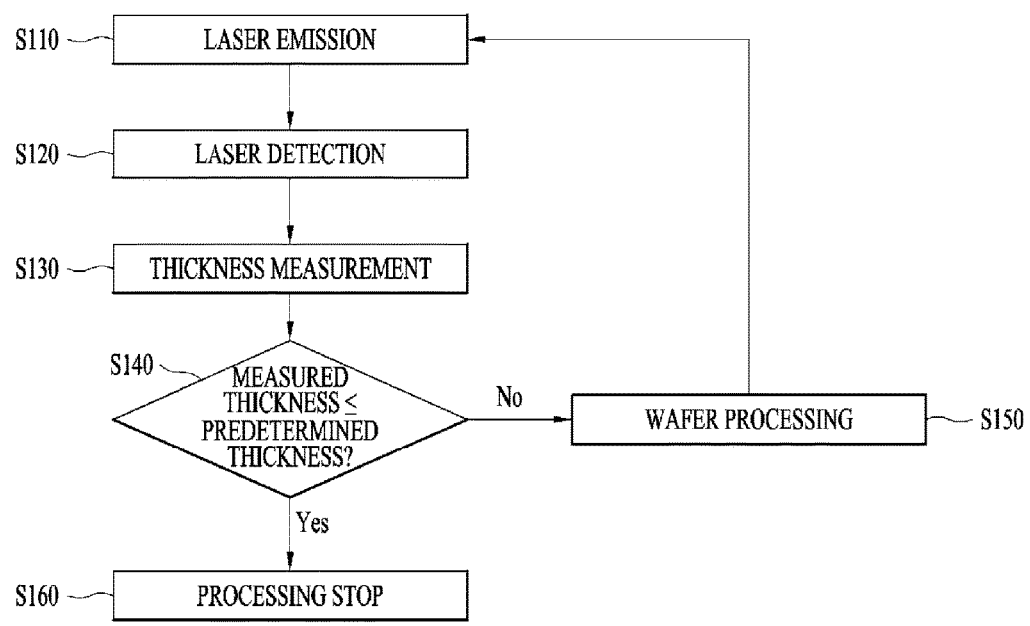
FIG. 7 is a flowchart illustrating a wafer-processing method according to an embodiment.

FIG. 7 is a flowchart illustrating a wafer-processing method according to an embodiment.

Referring to FIG. 7, the embodiment describes a method of processing wafers mounted on the transfer device 100 or 200 using the transfer device 100 or 200 including the laser emission unit 130 and the laser detection unit 160.

First, a laser is emitted to the wafers W1 to Wn (where n is a natural number greater than 1) mounted on the pedestals 151 to 154 of the transfer device 100 or 200 by the laser emission unit 130.

Subsequently, a laser that has passed between the wafers W1 to Wn (where n is a natural number greater than 1) mounted on the transfer device 100 or 200 is detected by the laser detection unit 160 (S120).

The thickness of the wafers W1 to Wn (where n is a natural number greater than 1) mounted on the transfer device 100 or 200 is measured based on the detected result (S130). The thickness of the wafers W1 to Wn (where n is a natural number greater than 1) may be measured as described above in connection with FIG. 4.

Based on the measured thickness of the wafers W1 to Wn (where n is a natural number greater than 1), the wafers W1 to Wn (where n is a natural number greater than 1) mounted on the transfer device 100 or 200 are processed (S140 to S160).

The measured thickness of the wafers W1 to Wn (where n is a natural number greater than 1) may be compared with a predetermined thickness value, and based on the comparison result, whether or not to perform a processing on the wafers W1 to Wn (where n is a natural number greater than 1) may be determined, or the processing time thereof may be controlled.

It is determined whether the measured thickness of the wafers W1 to Wn (where n is a natural number greater than 1) is equal to or less than a predetermined thickness value (S140).

When the measured thickness of the wafers W1 to Wn (where n is a natural number greater than 1) is greater than the predetermined thickness value, a processing process is performed on the wafers mounted on the transfer device 100 or 200 (S150).

At this time, based on the measured thickness of the wafers W1 to Wn (where n is a natural number greater than 1), the processing time for the wafers W1 to Wn (where n is a natural number greater than 1) mounted on the transfer device 100 or 200 may be controlled.

For example, the greater the difference between the measured thickness of the wafers W1 to Wn (where n is a natural number greater than 1) and the predetermined thickness value, the longer the processing time for the wafers W1 to Wn (where n is a natural number greater than 1).

The processing process for the wafers may include at least one of the etching process, the cleaning process, and the drying process illustrated in FIG. 3.

For example, the processing process for the wafers may include at least one of the etching process and the cleaning process illustrated in FIG. 3, and may further include the drying process illustrated in FIG. 3.

Subsequently, after the processing step S150 is performed, the laser emission step S110, the laser detection step S120, and the thickness measurement step S130 are performed in sequence, so as to measure the thickness of the wafers W1 to Wn (where n is a natural number greater than 1) processed in the processing step S150 (S110 to S130).

The laser emission step S110, the laser detection step S120, the thickness measurement step S130, the thickness comparison step S140, and the processing step S150 described above are repeatedly performed until the measured thickness of the wafers W1 to Wn (where n is a natural number greater than 1) processed in the processing step S150 is equal to or less than the predetermined thickness value.

In conclusion, when the measured thickness of the wafers W1 to Wn (n is a natural number greater than 1) processed in the processing step S150 is equal to or less than the predetermined thickness value, the processing for the wafers stops (S160).

For example, the thickness is measured by performing the steps S110 to S130. Then, when the measured thickness is not less than or equal to a predetermined thickness value (S140), the processing process (e.g. the etching process) may be performed on the wafers mounted on the transfer device 100 or 200 (S150).

The thickness of the wafers, which have been etched and cleaned in the processing process S150, is measured by performing the steps S110 to S130. Then, the measured thickness is compared with a predetermined thickness value (S140). When the measured thickness is greater than the predetermined thickness value, the processing process (e.g. the cleaning process) may be performed on the wafers mounted on the transfer device 100 or 200 (S150). On the other hand, when the measured thickness is equal to or less than the predetermined thickness value, the processing process for the wafers may stop.

In the embodiment, the thickness of the wafers may be measured in real time before and after the processing process, and based on the measured thickness, whether or not to perform a subsequent processing process may be determined and the processing time of the processing process may be adjusted. Thereby, the wafers may be processed to an accurate thickness.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

INDUSTRIAL APPLICABILITY

Embodiments may be used in a process of transferring a wafer, among wafer-manufacturing processes.

The invention claimed is:

1. A wafer transfer device comprising:
a guide configured to move in a vertical direction or in a horizontal direction;
a moving arm provided on the guide and supporting edge portions of wafers, which are spaced apart from each other such that front surfaces or rear surfaces of the wafers are parallel to the vertical direction;
a laser emission unit disposed on the guide and configured to emit a first laser to the wafers, which are seated on the moving arm and are spaced apart from each other; and
a laser detection unit disposed under the moving arm and configured to collect a second laser that is a portion of the first laser and has passed through a gap between the wafers, which are spaced apart from each other,
wherein the first laser has an emission area in the horizontal direction,
wherein a first end of the emission area is aligned with one end of a first wafer among the wafers, and a second end of the emission area is aligned with one end of a last wafer among the wafers,
wherein the one end of the first wafer is a surface of the first wafer opposite to another surface of the first wafer facing a second wafer among the wafers, and
wherein the one end of the last wafer is a surface of the last wafer opposite to another surface of the last wafer facing a wafer immediately before the last wafer.

2. The wafer transfer device according to claim 1, further comprising a controller configured to measure a thickness of the wafers, which are spaced apart from each other, based on the first laser emitted from the laser emission unit and the second laser collected by a laser collector.

3. The wafer transfer device according to claim 1, further comprising a laser detection unit support member connected between the guide and the laser detection unit and configured to secure the laser detection unit to the guide.

4. The wafer transfer device according to claim 3, wherein the laser detection unit support member moves in the horizontal direction or in the vertical direction along with the guide.

5. The wafer transfer device according to claim 3, wherein the laser detection unit support member includes:
a first laser detection unit support member configured to interconnect one end of the guide and one end of the laser detection unit; and
a second laser detection unit support member configured to interconnect a remaining end of the guide and a remaining end of the laser detection unit.

6. A wafer-processing method of processing wafers mounted on a wafer transfer device including a laser emission unit configured to emit a laser and a laser detection unit configured to detect the laser, the method comprising:
emitting a first laser having an emission area in a horizontal direction to the wafers mounted on the wafer transfer device by the laser emission unit;
detecting a second laser that has passed between the wafers mounted on the wafer transfer device by the laser detection unit;
measuring a thickness of the wafers mounted on the wafer transfer device based on the detected result; and
processing the wafers mounted on the wafer transfer device based on the measured thickness,
wherein the wafers mounted on the wafer transfer device are spaced apart from each other such that front surfaces or rear surfaces of the wafers are parallel to a vertical direction,
wherein a first end of the emission area is aligned with one end of a first wafer among the wafers mounted on the wafer transfer device, and a second end of the emission area is aligned with one end of a last wafer among the wafers mounted on the wafer transfer device
wherein the one end of the first wafer is a surface of the first wafer opposite to another surface of the first wafer facing a second wafer among the wafers mounted on the wafer transfer device, and
wherein the one end of the last wafer is a surface of the last wafer opposite to another surface of the last wafer facing a wafer immediately before the last wafer.

7. The wafer-processing method according to claim 6, further comprising transferring the wafers by the wafer transfer device,
wherein the emitting, the detecting, and the measuring are performed during the transferring.

8. The wafer-processing method according to claim 6, further comprising comparing the measured thickness of the wafers with a predetermined thickness value,
wherein the processing includes determining whether or not to perform a processing on the wafers or controlling a processing time based on a comparison result in the comparing.

9. The wafer-processing method according to claim 8, further comprising:
measuring, after the processing, a thickness of the wafers, processed in the processing, by performing the emitting, the detecting, and the measuring; and
repeatedly performing the emitting, the detecting, the measuring, the comparing, and the processing until the measured thickness of the wafers processed in the processing becomes equal to the predetermined thickness value.

10. The wafer-processing method according to claim 6, wherein the processing includes etching the wafers.

11. The wafer-processing method according to claim 10, wherein the processing further includes cleaning the wafers etched in the etching.

12. The wafer-processing method according to claim 11, wherein the processing further includes drying the wafers cleaned in the cleaning.

\* \* \* \* \*